United States Patent
Wen et al.

(10) Patent No.: US 10,581,445 B2
(45) Date of Patent: *Mar. 3, 2020

(54) DIGITALLY CALIBRATED SUCCESSIVE APPROXIMATION REGISTER ANALOG-TO-DIGITAL CONVERTER

(71) Applicant: Avnera Corporation, Beaverton, OR (US)

(72) Inventors: Jianping Wen, Beaverton, OR (US); Garry Link, Pacific City, OR (US); Wai Laing Lee, Austin, TX (US)

(73) Assignee: Avnera Corporation, Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/159,498

(22) Filed: Oct. 12, 2018

(65) Prior Publication Data

US 2019/0222219 A1    Jul. 18, 2019

Related U.S. Application Data

(60) Continuation of application No. 15/799,812, filed on Oct. 31, 2017, now Pat. No. 10,135,455, which is a
(Continued)

(51) Int. Cl.
*H03M 1/10* (2006.01)
*H03M 1/06* (2006.01)
*H03M 1/40* (2006.01)
*H03M 1/46* (2006.01)
*H03M 1/38* (2006.01)
*H03M 1/80* (2006.01)

(52) U.S. Cl.
CPC ....... *H03M 1/1009* (2013.01); *H03M 1/0692* (2013.01); *H03M 1/38* (2013.01); *H03M 1/403* (2013.01); *H03M 1/462* (2013.01); *H05K 999/99* (2013.01); *H03M 1/0682* (2013.01); *H03M 1/468* (2013.01); *H03M 1/804* (2013.01)

(58) Field of Classification Search
None
See application file for complete search history.

(56) References Cited

U.S. PATENT DOCUMENTS 6,603,415 B1    8/2003    Somayajula
7,432,844 B2    10/2008   Mueck et al.
(Continued)

*Primary Examiner* — Howard Williams
(74) *Attorney, Agent, or Firm* — Knobbe, Martens, Olson & Bear, LLP

(57) ABSTRACT

A system can include an analog input port; a digital output port; and a successive approximation register (SAR) analog-to-digital converter (ADC). The SAR ADC can include a voltage comparator $V_d$ having a first input, a second input, and an output; a first plurality of capacitors $C_p[0:n]$ that are coupled with the analog input port and each have a top plate and a bottom plate; a second plurality of capacitors $C_n[0:n]$ that are coupled with the analog input port and each have a top plate and a bottom plate; and a SAR controller coupled between the output of the voltage comparator $V_d$ and the digital output port.

20 Claims, 14 Drawing Sheets

Related U.S. Application Data continuation of application No. 15/391,573, filed on Dec. 27, 2016, now Pat. No. 9,831,887, which is a division of application No. 14/932,798, filed on Nov. 4, 2015, now Pat. No. 9,531,400.

(56) References Cited

U.S. PATENT DOCUMENTS

| | | | |
|---|---|---|---|
| 3,040,271 | A1 | 10/2011 | Furuta et al. |
| 8,164,504 | B2 * | 4/2012 | Cho .................... H03M 1/0678 |
| | | | 341/118 |
| 8,451,151 | B2 | 5/2013 | Lin |
| 8,896,478 | B2 * | 11/2014 | Tsai ...................... H03M 1/069 |
| | | | 341/144 |
| 8,928,515 | B1 | 1/2015 | Hu et al. |
| 9,106,246 | B2 | 8/2015 | Yang |
| 9,531,400 | B1 | 12/2016 | Wen et al. |
| 10,135,455 | B2 | 11/2018 | Wen et al. |

* cited by examiner

DIGITALLY CALIBRATED SUCCESSIVE APPROXIMATION REGISTER ANALOG-TO-DIGITAL CONVERTER

CROSS-REFERENCE TO RELATED APPLICATIONS

This application is a continuation of U.S. Non-Provisional patent application Ser. No. 15/799,812, entitled DIGITALLY CALIBRATED SUCCESSIVE APPROXIMATION REGISTER ANALOG-TO-DIGITAL CONVERTER, filed Oct. 31, 2017, which is a continuation of U.S. Non-Provisional patent application Ser. No. 15/391,573, entitled DIGITALLY CALIBRATED SUCCESSIVE APPROXIMATION REGISTER ANALOG-TO-DIGITAL CONVERTER, filed Dec. 27, 2016, which is a division of U.S. Non-Provisional patent application Ser. No. 14/932,798, entitled DIGITALLY CALIBRATED SUCCESSIVE APPROXIMATION REGISTER ANALOG-TO-DIGITAL CONVERTER, filed Nov. 4, 2015, now U.S. Pat. No. 9,531,400, issued Dec. 27, 2016, the contents of each of which are incorporated herein by reference in their entirety.

TECHNICAL FIELD

This disclosure pertains generally to analog-to-digital circuitry and, more particularly, to circuitry configured to convert a continuous analog waveform into a discrete digital representation using a binary search to converge upon a digital output for each conversion.

BACKGROUND

Successive approximation register analog to digital converters (SAR ADCs) are among the most popular Nyquist rate ADCs because of their reasonably high conversion speed with moderate accuracy and circuit complexity. FIG. 1 illustrates the general architecture of a prior SAR ADC 100, which includes a sample and hold (S/H) circuit 102 to acquire an analog input, an analog voltage comparator 104 to compare the input to the output of a digital-to-analog converter (DAC) 106 and output the result of the comparison to a SAR 108, which is configured to provide a digital approximation of the analog input.

FIG. 2 illustrates the conceptual operation 200 of a prior SAR ADC. In the example, the analog input (represented by the horizontal dashed line) held by the sample and hold circuit (such as the S/H circuit 102 of FIG. 1) is first tested against half of the reference voltage ($V_{ref}/2$) that is generated by the DAC (such as the DAC 106 of FIG. 1). Since the analog sample is higher than $V_{ref}/2$, the comparator output is a 1, which is the most significant bit (MSB) of the quantized digital output and is also stored in the register SAR. The analog input sample is then tested against the DAC output $(1/2+1/4)*V_{ref}$ that leads to a comparator output of 0, which is the second MSB and is saved in the register SAR. This operation is repeated such that the DAC output successively approaches the true analog input sample with an accuracy that is limited only by the number of DAC bits. At the end of the conversion, the analog input is approximated by the DAC output of $(1/2+0/4+0/8+0/16+1/32+1/64+0/128+1/256)*V_{ref}$, and the 8-bit digital output corresponding to the analog input sample is 1000_1101.

After the input is sampled, the conversion starts from minimum code in which all of the bits are reset to 0 except the MSB of the DAC, which is set to 1 to generate the MSB reference level. Then, the analog sample is tested against the MSB reference level to decide whether the MSB is to be kept (e.g., whether the MSB remains at 1 for the rest of the conversion cycles) or discarded (e.g., whether the MSB is reset back to 0 for the rest of the conversion cycles). This "test, keep, or discard" strategy proceeds from MSB to LSB to complete the encoding of one analog sample. Because each bit has two states due to the "keep or discard" decisions, the analog input is encoded in a binary encoding system.

In a differential implementation, which is often the choice of a high performance SAR ADC, the analog input 0 corresponds to a DAC code that generates $V_{ref}/2$ as illustrated in FIG. 2, which is the mid-code of the binary encoding system. Whereas the negative peak input of a full scale signal corresponds to DAC code with all 0's, the positive peak input of a full scale signal corresponds to DAC code with all 1's.

Such prior successive approximation algorithms assume that the reference voltages generated by the DAC in every conversion cycle are accurate. In other words, any ratio error among the DAC bits will lead to signal distortion. The most effective way for a DAC to generate reference voltages with ratio matrices is through device matching, which can hardly achieve more than 12-bits of accuracy given commercial CMOS technologies. In order to design a SAR ADC with accuracy of 16-bit or higher, digital calibration techniques must be used.

The principle of digital calibration is to measure the error terms of ratios among DAC bits prior to normal SAR conversions. These error terms can be used to correct DAC outputs during normal SAR conversions (see, e.g., Hae-Seung Lee, et al., "A self-Calibrating 12b 12 μs CMOS ADC", Proceedings of 1984 IEEE International Solid-State Circuits Conference, pp. 64-65), where the DAC needs extra analog circuitry of which the accuracy itself poses the limit of the overall conversion.

Embodiments of the invention address these and other issues in the prior art.

SUMMARY

Certain implementations of the disclosed technology may include a voltage comparator $V_d$ having two inputs and an output, as well as capacitors $C_p[0:n]$ that each have a top plate and a bottom plate, each top plate being electrically coupled with a first input of the voltage comparator $V_d$, each top plate being switchably electrically coupled with a common mode voltage $V_{cm}$, and each bottom plate being switchably electrically coupled between a first input voltage $V_{inp}$, a reference voltage $V_{ref}$, the common mode voltage $V_{cm}$, and ground.

Other capacitors $C_n[0:n]$ may each have a top plate and a bottom plate, each top plate being electrically coupled with a second input of the voltage comparator $V_d$, each top plate being switchably electrically coupled with the common mode voltage $V_{cm}$, and each bottom plate being switchably electrically coupled between a second input voltage $V_{inn}$, the reference voltage $V_{ref}$, the common mode voltage $V_{cm}$, and ground. Such implementations may also include a successive approximation register (SAR) controller coupled with the output of the voltage comparator $V_d$.

The collapsible radix design methodologies and corresponding collapsible algorithms are not limited to switched capacitor implementations, however. Such techniques can be applied to any other type of SAR architecture, such as switching current implementations and resistor ladder implementations, for example.

The non-binary radix design describe herein advantageously provides a conversion redundancy that permits a power reduction of the comparator during conversions of most significant bits (MSBs). In addition to the non-binary radix design, a combination of the collapsible radix design described herein with a collapsible algorithm may advantageously realize a balanced ternary encoding system with a single comparator to reduce the accumulated calibration error introduced by noise floor. These techniques also avoid asymmetries of redundancy region that are common to conventional non-binary radix designs. In certain embodiments, an oversampling ΔΣ ADC may be used for weight calibration to achieve high calibration accuracy. In other embodiments, a C-2C DAC array structure may be used for area efficiency.

DETAILED DESCRIPTION

The target ratios among digital-to-analog converter (DAC) bits to be calibrated can be binary or non-binary. Binary DACs generally have the advantage of simplicity in design and, therefore, are selected for the majority of SAR ADC designs. However, a typical binary DAC design requires that the accuracy of comparator needs be at least the same as that of the DAC itself during the entire conversion cycles from most significant bit (MSB) to least significant bit (LSB). Although the accuracy of the DAC can be enhanced by calibration, as the only active component in a SAR ADC, the accuracy of the comparator can only be improved by increasing its area and power to reduce the error introduced by circuit noise. Therefore, in the design of a low-power high-resolution SAR ADC, non-binary ratios among DAC bits should be used to provide conversion redundancy.

Fundamentally speaking, a SAR having a binary radix DAC versus a non-binary radix DAC is generally a trade-off between conversion efficiency and conversion error tolerance. With a binary radix DAC, an N-bit SAR can achieve a resolution of $2^{(-N)}$ with N conversion cycles; on the other hand, an N-bit SAR having non-binary radix R can achieve resolution of $R^{(-N)}$ with N conversion cycles. Since R<2 (R>2 should not be used since it leads to missing code in a binary searching mechanism), a binary radix SAR is generally more efficient (in terms of number of conversion cycles per sample) but requires a comparator having equal resolution as stated above. Although a non-binary radix SAR requires more cycles than a binary SAR does to achieve the same resolution, it allows the comparator make an erroneous decision at a particular bit so long as the error is within the redundancy range of that bit, and this error is recoverable from lower bits.

Figure 1:
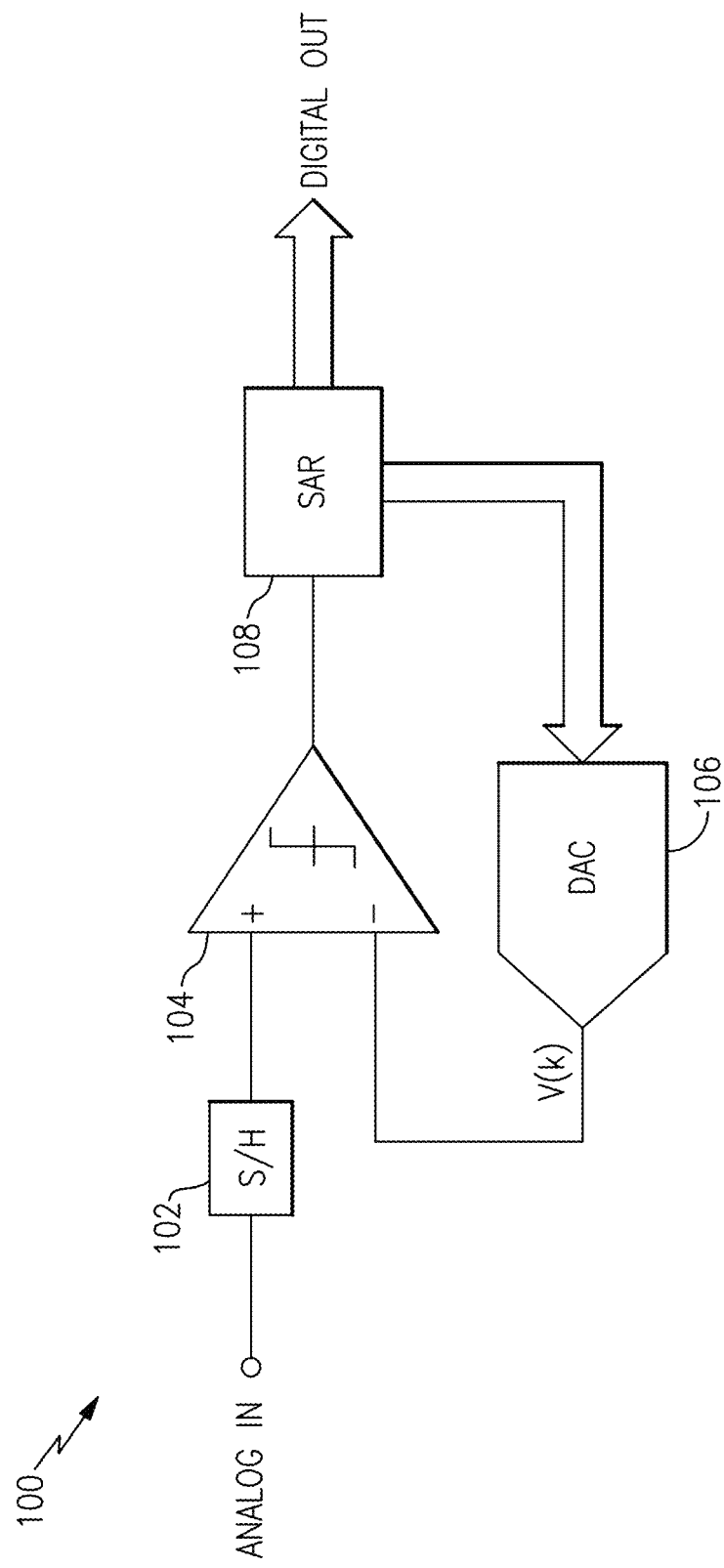
FIG. 1 illustrates the general architecture of a prior successive approximation register (SAR) analog-to-digital converter (ADC).
Figure 2:
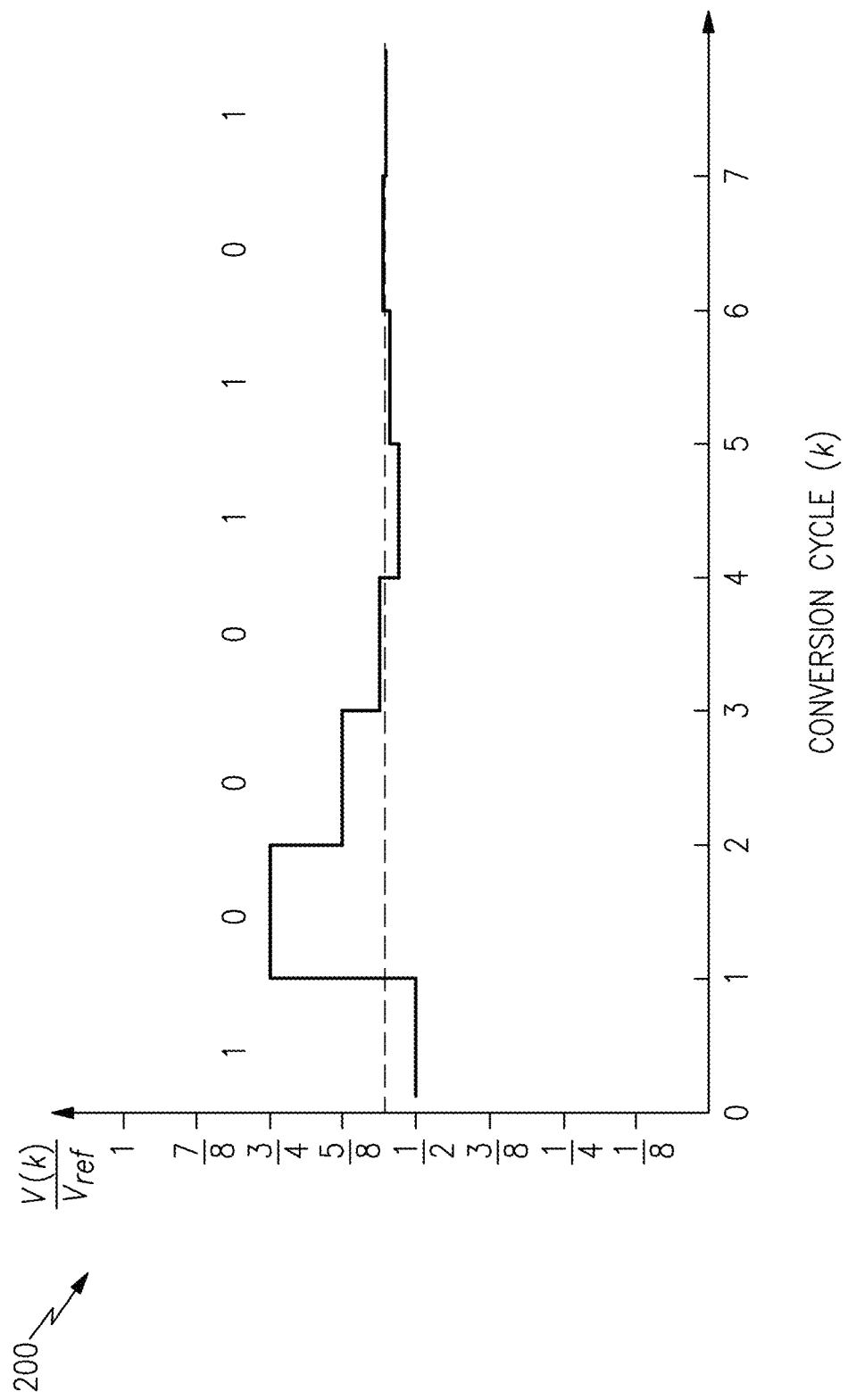
FIG. 2 illustrates the conceptual operation of a prior SAR ADC.
Figure 3:
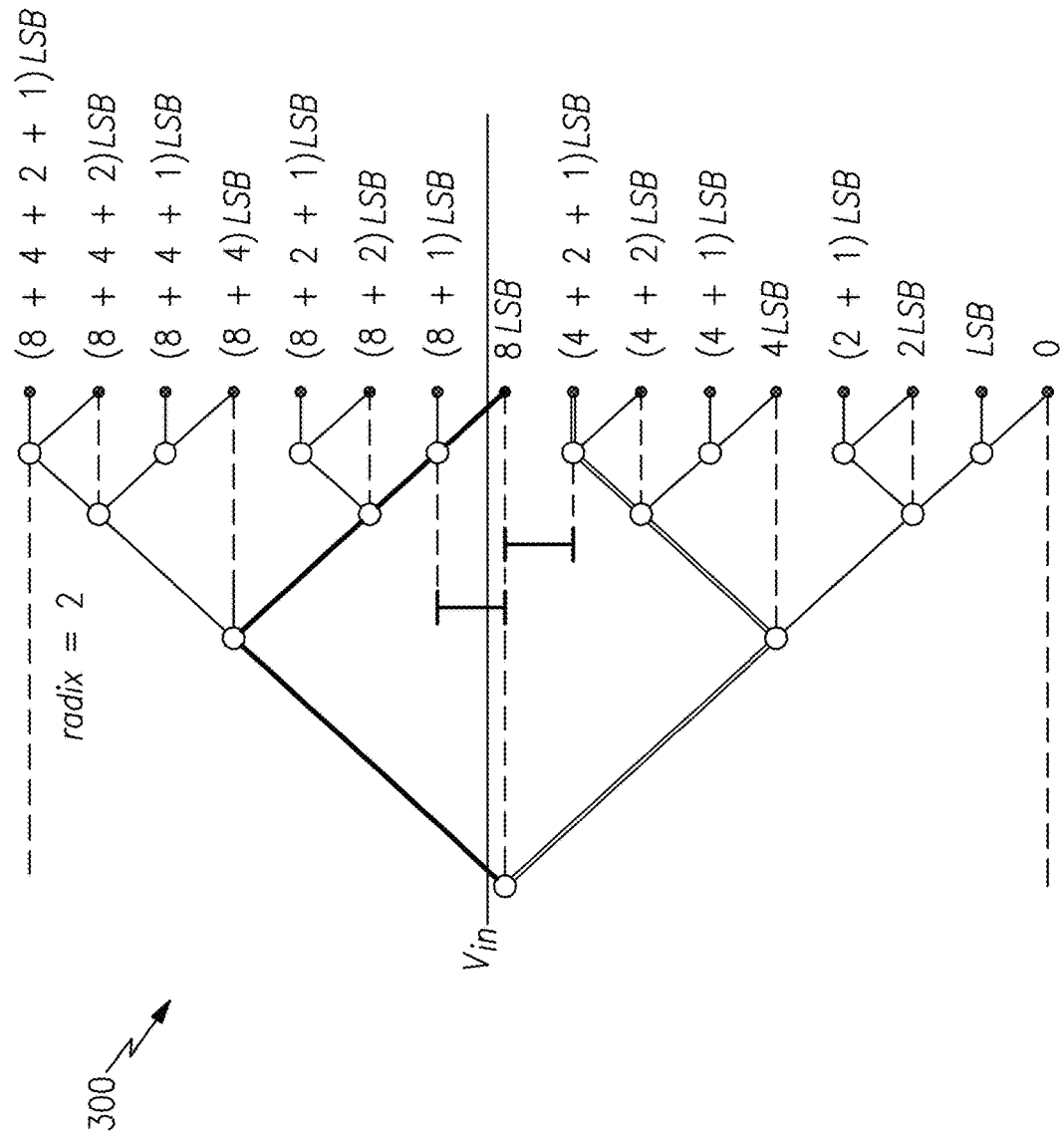
FIG. 3 illustrates an example of the decision tree of a binary SAR.

FIG. 3 illustrates an example of a decision tree 300 of a binary SAR. In FIG. 3, the blue line represents the analog input level and the red trace depicts the correct decision tree, which generates the final conversion code of 1000. This code means that the analog input is between 8 LSB and 9 LSB. The green trace, on the other hand, depicts what happens when a wrong decision is made at MSB (b[3]): b[3]=0 results from comparator error. The maximum code after the subsequent SAR cycles will be 0111, which represents the analog input range between 7 LSB and 8 LSB. Since the true analog input is between 8 LSB and 9 LSB, this MSB error cannot be recovered by LSBs.

FIG. 3 clearly shows that for a binary radix SAR each code covers a unique range of analog input, or that there is no redundancy in code coverage. For example, code 1000 covers inputs between 8 LSB and 9 LSB, and code 0111 covers inputs between 7 LSB and 8 LSB. Zero redundancy of a binary radix SAR requires that the comparator needs to make a correct decision at every bit, including the MSB.

Figure 4:
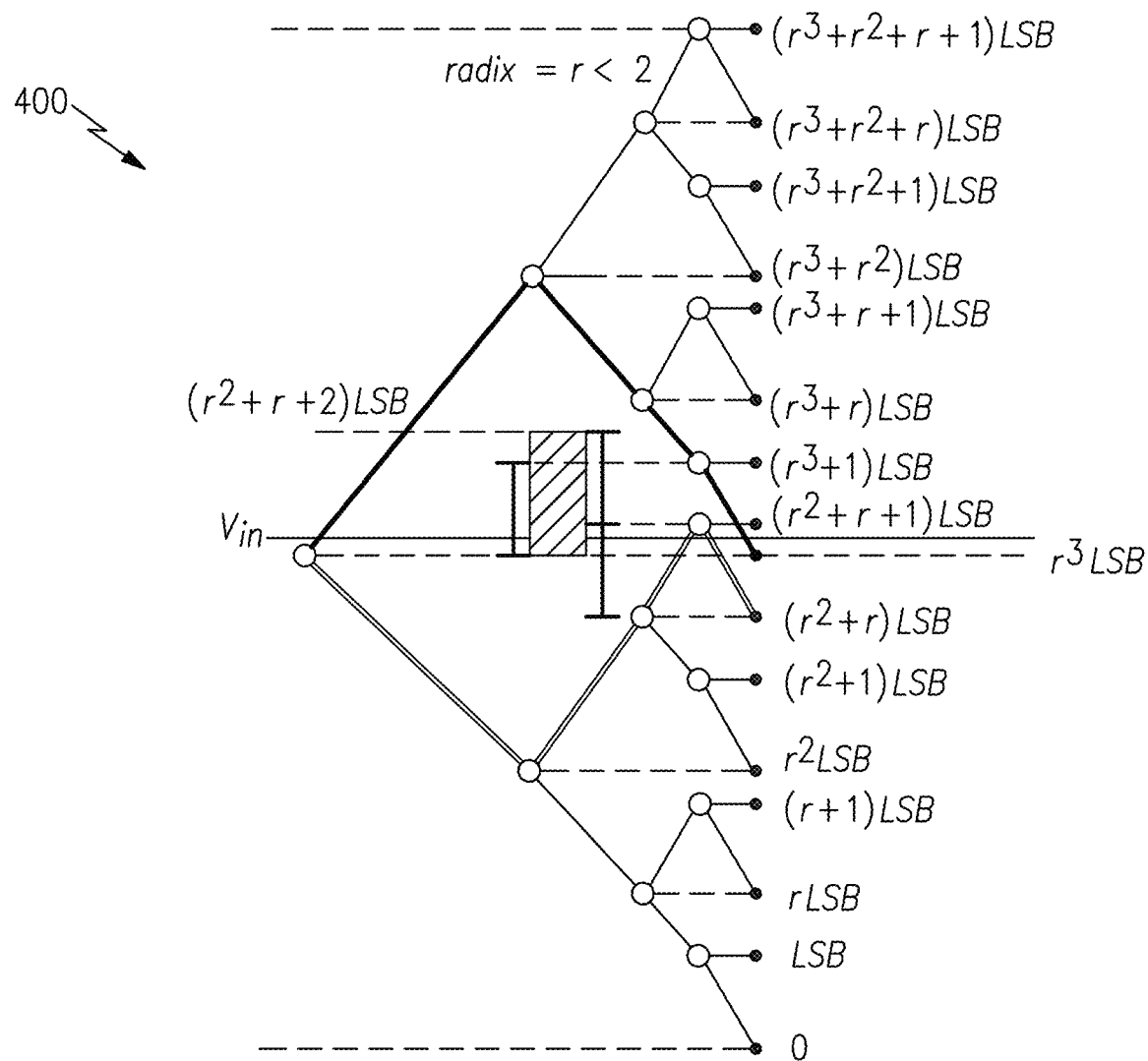
FIG. 4 illustrates an example of the decision tree of a non-binary SAR.

FIG. 4 illustrates an example of a decision tree 400 of a non-binary SAR. In order to have code coverage redundancy, the radix needs to be less than 2 as shown in FIG. 4. If r is used to denote the radix as shown in the diagram, weights of bits b[0], b[1], b[2] and b[4] are 1, r, $r^2$, and $r^3$, respectively. The red trace represents the correct decision tree for the analog input level indicated by the blue line, which results in code "1000" that covers the input range between $r^3$*LSB and $(r^3+1)$*LSB.

If an error happens at the comparator that gives MSB=0 instead of MSB=1, and no more mistake is made in subsequent SAR cycles: Vin>$r^2$*LSB leads to b[2]=1, Vin>$(r^2+r)$LSB leads to b[1]=1, and Vin<$(r^2+r+1)$ leads to b[0]=0, therefore the green decision trace results in code "0110". This code covers the input range between $(r^2+r)$*LSB and $(r^2+r+1)$*LSB. This code also covers the true analog input as shown. In other words, an MSB error made by the comparator can be recovered by correct LSB decisions.

FIG. 4 also shows that when $V_{in}$>$r^3$*LSB, or when the analog input is above b[3] level, as long as $V_{in}$<$(r^2+r+2)$*LSB, the comparator is allowed to make a wrong decision b[3]=0 instead of the correct one b[3]=1 and the mistake can be recoverable by correct decisions made at lower bits. In other words, the decision error tolerance of b[3] is [(r^2+r+2)−r^3]*LSB, which is also defined as a redundancy of b[3]. In general, the redundancy of any bit b[k] can be calculated by the following formula:

$$R_k = W_0 + \sum_{i=0}^{k-1} W_i - W_k$$

where $W_k$ represents the weight of b[k], and $W_0$ represents the weight of LSB. So long as the redundancy of a bit is positive, and comparator decision error is smaller than the redundancy range of that bit, the error will usually be recoverable by correct decisions from lower bits.

The redundancy of a non-binary radix SAR greatly relaxes the comparator accuracy requirement. Because redundancy usually increases from LSB to MSB, comparator power consumption for several MSBs can be reduced to allow larger noise, and a high precision comparator is only necessary for the last several LSBs. Such a scheme will desirably cut down system power consumption substantially since the comparator is the only fundamental active component in the SAR. Such a scheme may be used to develop a low power high resolution SAR ADC for audio applications, for example.

Unlike the binary radix SAR where the SAR output code can be directly used as binary code by DSP processors, the output of an arbitrary non-binary radix SAR may be post-processed by the following calculation before it is sent to the digital signal processor (DSP) as binary code:

$$D = \frac{\sum_{i=0}^{N-1} b_i W_i}{\sum_{i=0}^{N-1} W_i}$$

where $W_i$ represents the weight of bit b[i]. Bit weights used by a digital post-processor in this formula generally accurately reflect the bit weights implemented by analog components in the SAR encoding process. Any discrepancy between digital weights and analog component weights may introduce ADC distortion. In other words, calibration accuracy of bit weights usually determines the resolution of the SAR ADC.

Figure 5:
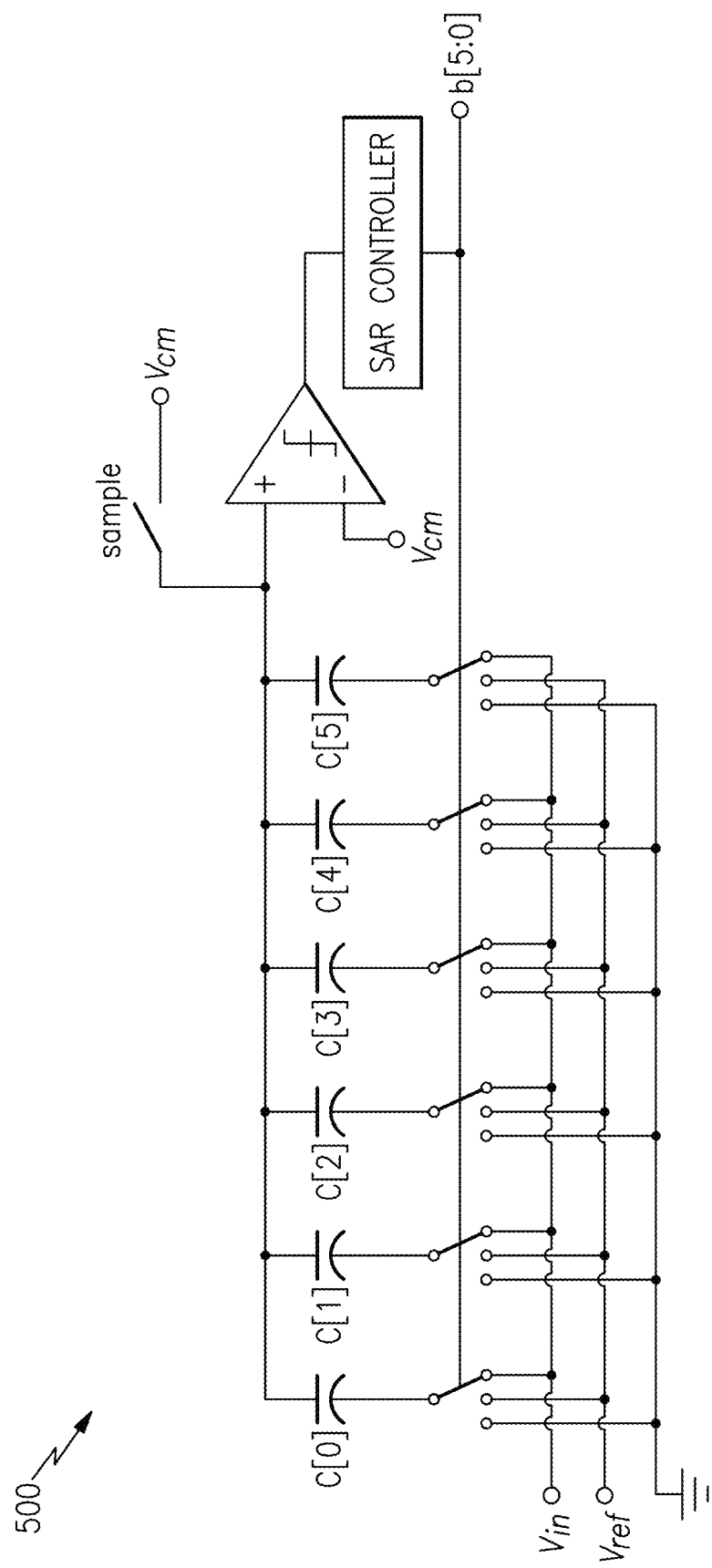
FIG. 5 illustrates an example of a 6-bit switched capacitor SAR ADC.

In order to describe the bit weights calibration by an oversampling ΔΣ ADC, one may consider a switched capacitor SAR implementation such as that illustrated by FIG. 5.

FIG. 5 illustrates an example of a 6-bit switched capacitor SAR 500. Although the switched capacitor DAC is typically implemented in a differential architecture to improve noise immunity, the illustrated example is drawn in a single-ended version for visual brevity. The bit weights are defined by the capacitors C[5:0]. In a sample phase, the bottoms of the capacitors are connected to the input while their common top plates are shorted to the common mode voltage $V_{cm}$. At the end of sample phase, the top plate is disconnected from $V_{cm}$. Since the voltage drop of all capacitors is the same ($V_{cm}-V_{in}$), the sample charge stored in each capacitor is proportional to its capacitance, or bit weight.

When the first SAR cycle starts after the sampling phase, all of the bottom plates of the capacitors are connected to ground but that of MSB C[5] is connected to $V_{ref}$ as a test configuration to determine the MSB value. At the end of the first SAR cycle, the comparator makes a decision: 1 means that the MSB charge is too much and, thus, needs to be discarded and, therefore, b[5]=0 connects the bottom plate of C[5] back to ground; on the other hand, 0 means the MSB charge is not enough and, thus, needs to be kept, or b[5]=1 keeps the bottom plate of C[5] connected to $V_{ref}$. Then, the second MSB (C[4]) is tested the same way in the next SAR cycle. This sequence continues until the bottom plate of LSB capacitor C[0] is decided, and the top plate voltage will be closest to $V_{cm}$, only deviated from $V_{cm}$ by one LSB.

As described above, the bit weight calibration of a switched capacitor SAR is identical to measure the capacitance of each bit. The dynamic range of measurement will be the same as the range of capacitance values. For example, in a 20-bit SAR of radix 1.85 capacitor array, if the MSB capacitance is 8 pF, the LSB capacitance will be 67 aF. It is not trivial to accurately measure capacitance values that spread in such a wide range. In this disclosure, a switched capacitor ΔΣ ADC is used to perform this task, as described below.

Figure 6:
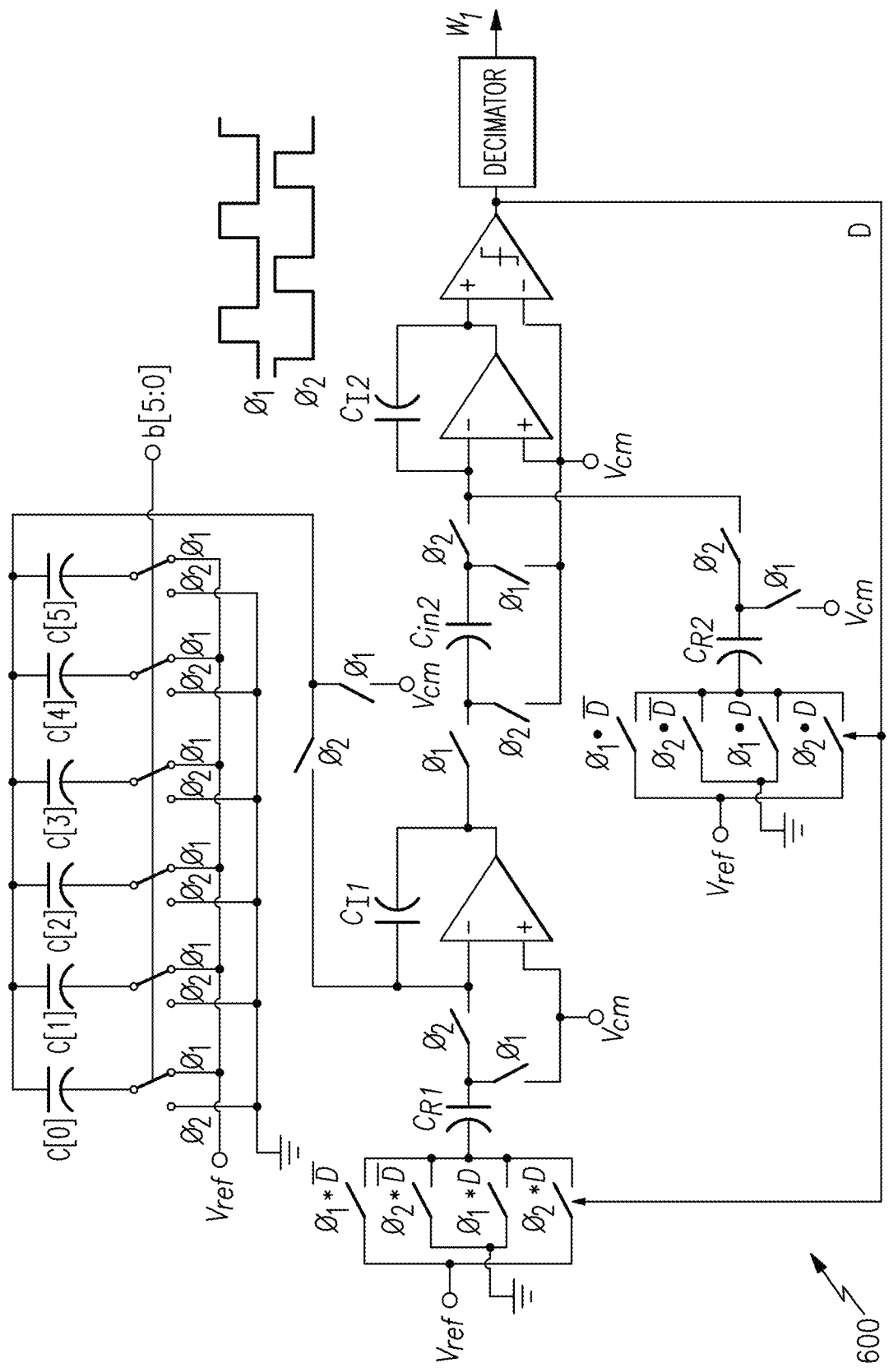
FIG. 6 illustrates an example of a bit weight calibration using a second order ΔΣ ADC.

FIG. 6 illustrates an example of a bit weight calibration using a second order ΔΣ ADC 600. In FIG. 6, b[5:0] selects the capacitor bit that will be calibrated. The bottom plate of the selected capacitor will be connected to $V_{ref}$ in Φ1 and to ground in Φ2, where Φ1 and Φ2 are non-overlap clock phases. The bottom plates of the unselected capacitors will be tied to ground. In this way, the capacitor in calibration will periodically dump a fixed amount of input charge to the integrator capacitor $C_{I1}$ of the first integrator of the ΔΣ modulator. The comparator makes a decision at the end of Φ2, which in turn will decide the polarity of reference charge from reference capacitors $C_{R1}$ of integrator 1 and $C_{R2}$ of integrator 2 that will be dumped to $C_{I1}$ and $C_{I2}$ in the next cycle. The decision sequence D will be sent to the digital decimation filter, of which the output $W_i$ will be proportional to the capacitance under calibration.

The calibration resolution can be arbitrarily high in FIG. 6 as long as the integrator OTA gain is high enough to avoid a dead zone of calibration ΔΣ ADC. In reality, the calibration resolution is usually limited by circuit thermal noise and calibration time. A higher order ΔΣ ADC can generally relax the gain requirement of the OTA and thus shorten the calibration time.

The conventional algorithm of a SAR ADC uses the "test, keep or discard" strategy for every bit to encode analog input, as described above. For example, after the input is sampled, the MSB is tested first by connecting the bottom plate of the MSB to $V_{ref}$ and those of all LSBs are connected to ground. If the test result (comparator decision) is positive, the MSB needs to be discarded or the bottom plate of the MSB needs to be grounded; if the test result is negative, the MSB needs to be kept or the bottom plate of MSB needs to stay connected to $V_{ref}$ for the rest of conversion cycles. Then the same procedure is repeated from the second MSB to the LSB sequentially.

Such an algorithm has two disadvantages. The first one is related to the asymmetry of the redundancy range, and the second one is related to the accumulated calibration error introduced noise floor under small signal conditions.

FIG. 4 illustrates the asymmetry of the redundancy range. The redundancy range of the MSB is between r^3*LSB and (r^2+r+2)*LSB. In other words, if the analog input $V_{in}$ is above the MSB reference level r^3*LSB, the MSB decision error can be recovered by correct decisions from lower bits so long as $V_{in}<(r^2+r+2)*LSB$.

If the analog input is slightly below r^3*LSB, the correct decision tree should follow the green trace in FIG. 4. If the MSB decision error leads to the red trace, this error cannot be recovered by correct decisions of lower bits, because once the MSB is kept by mistake, all LSBs are discarded as they should be by correct decisions, the final quantized output is $r^3*LSB$, and its quantization level range $r^3*LSB \sim (r^3+1)*LSB$ excludes the true analog input $V_{in} < r^3*LSB$.

In order to make the redundancy range symmetrical around a decision level with the conventional SAR algorithm, instead of being tested against the bit reference level, the analog input is tested against a reference level that is located in the middle of the redundancy range. FIG. 4 may still be used as an example. When the MSB is tested, the analog input is not compared to the MSB reference level $r^3*LSB$. Instead, it is compared to a reference level that is at the middle between $r^3*LSB$ and $(r^2+r+2)*LSB$, or ideally at $(r^3+r^2+r+2)*LSB/2$, which can be formed by the MSB and some combinations of LSBs. In other words, the MSB decision will be made by testing the analog input against the MSB plus a test vector instead of the MSB alone.

An asymmetry of redundancy range exists for every bit. To center the redundancy ranges, different test vectors need to be used for different bits. This test vector compensation to the conventional SAR ADC requires extra hardware and a complex algorithm to implement.

Figure 7:
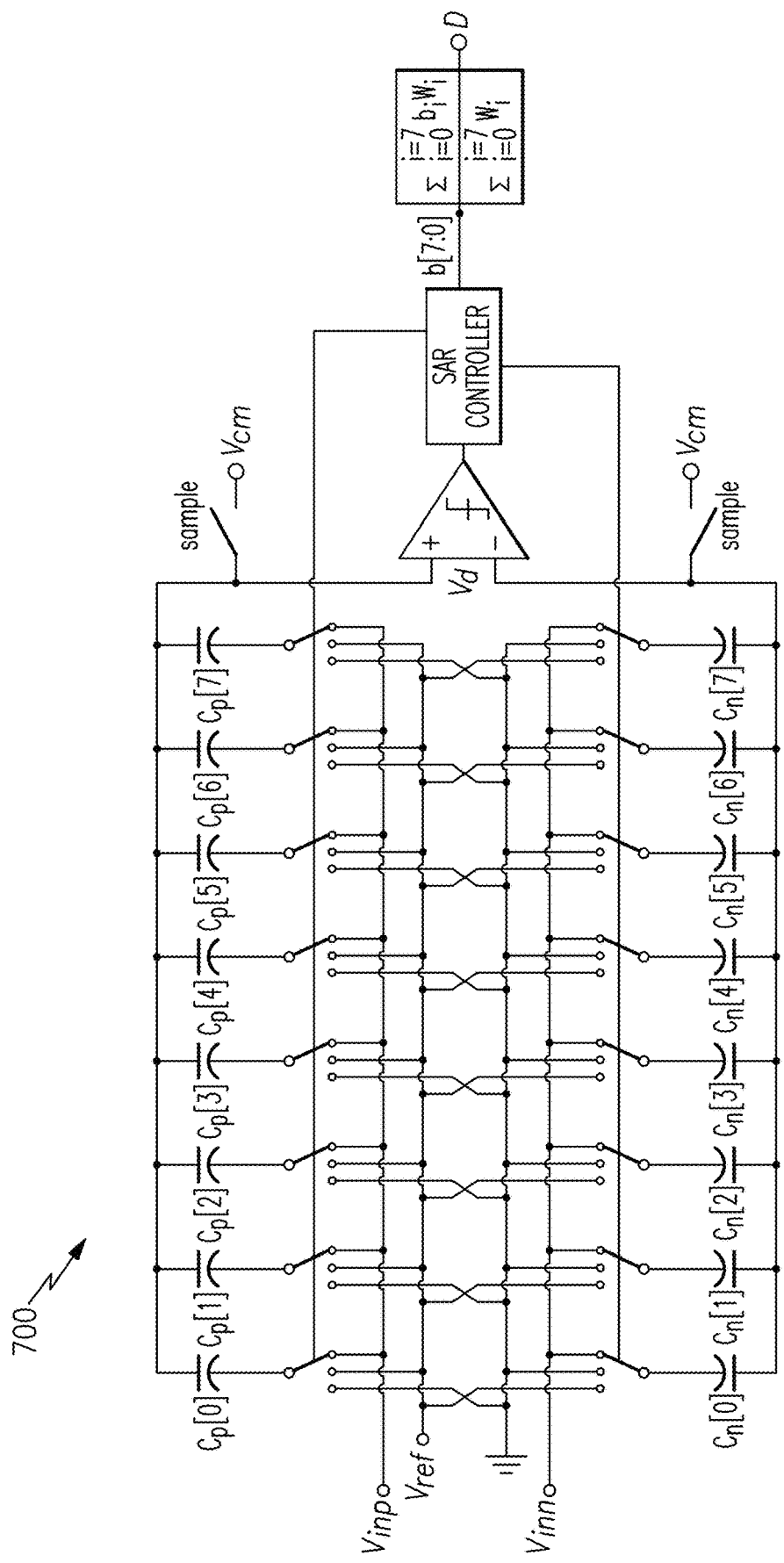
FIG. 7 illustrates an example of an 8-bit switched capacitor SAR ADC.

In a conventional SAR, due to the "keep or discard" decision of each bit after it is tested against a reference level, every bit has binary values. FIG. 7 illustrates an example of an 8-bit differential switched capacitor SAR ADC 700.

Figure 8:
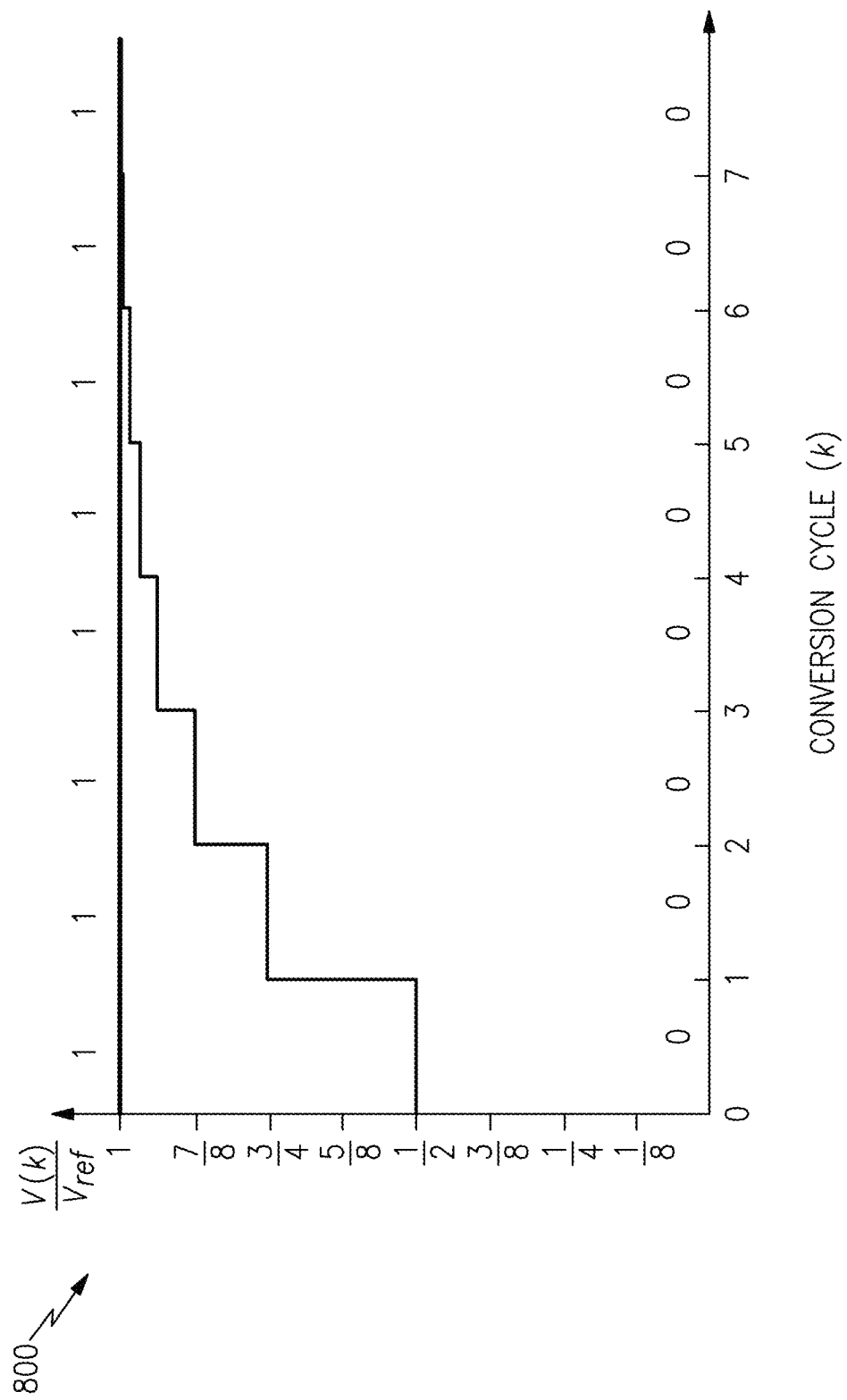
FIG. 8 illustrates an example of the minimum and maximum code of an 8-bit SAR ADC such as that illustrated by FIG. 7.

When this binary coding system is used to encode the differential analog signal, the negative peak input of a full scale signal corresponds to DAC code that generates a minimum reference level, of which all bits are 0's as represented by the green line in FIG. 8; the positive peak input of a full scale signal corresponds to DAC code that generates a maximum reference level $V_{ref}$, of which all bits are 1's as represented by the blue line in FIG. 8, which illustrates an example of the minimum and maximum code 800 of an 8-bit SAR ADC such as that illustrated by FIG. 7.

Figure 9:
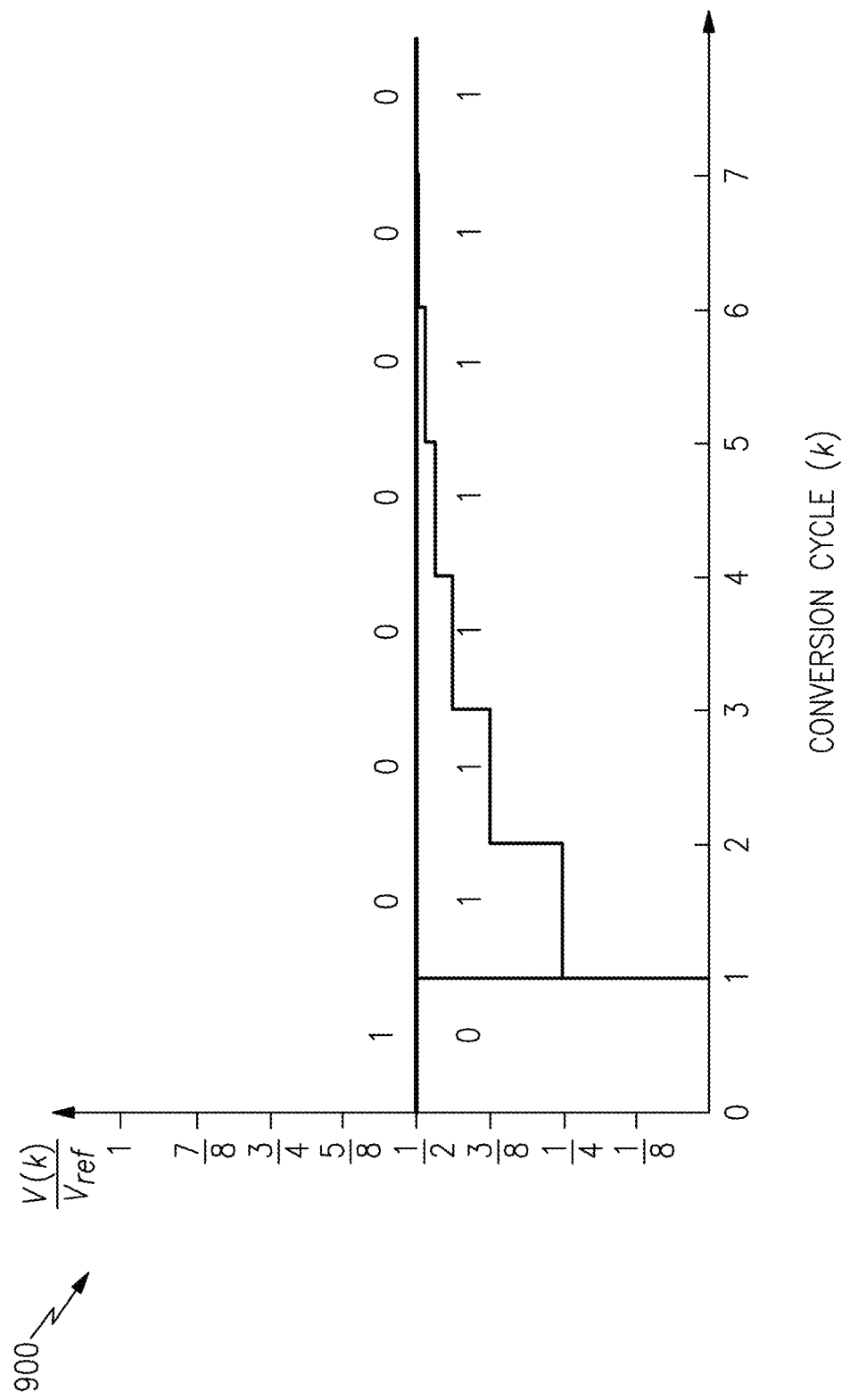
FIG. 9 illustrates an example of the mid-code of an 8-bit SAR ADC such as that illustrated by FIG. 7.

When the input signal is around differential 0 (small signal condition), the DAC code will vary around its mid-code that generates a reference level at half of the full reference level range, or $V_{ref}/2$ as represented by the red line in FIG. 9, which illustrates an example of the mid-code 900 of an 8-bit SAR ADC such as that illustrated by FIG. 7. In the figure, if the analog differential input is slightly above 0, the MSB will be kept and all LSB will be discarded, which results in code 1000_0000; if the analog differential input is slightly below 0, the MSB will be discarded and all LSB will be kept, which results in code 0111_1111. Under such a small signal condition, the SAR output code will constantly transit between code 1000_0000 and 0111_1111.

Code transition around mid-code of a conventional SAR under small signal condition requires the calibration resolution to be much higher than that of the SAR ADC itself. For an N-bit SAR, if the random calibration error is E for every bit, the accumulated output error for code 10 . . . 00 will be E, and the accumulated output error for code 01 . . . 11 will be $\sqrt{N-1}E$. This randomly varying error should not exceed the SAR noise floor. In other words, the SNR of the calibration ADC must be at least $20 \log 10\sqrt{N-1}$ dB better than that of the SAR ADC itself. For N=20, a SNR of calibration ADC must be 13 dB better than that of the SAR itself.

As discussed above, if a 20-bit SAR with average radix of 1.85 and MSB capacitance is 8 pF ($8 \times 10^{-12}$ F), the smallest capacitance the calibration ADC needs to measure is about 67 aF ($67 \times 10^{-18}$ F). This is already non-trivial. However, the accumulated calibration error introduced noise described above requires that the capacitance measurement error needs to be less than 15 aF ($15 \times 10^{-18}$ F), which will make the implementation extremely difficult.

A new algorithm is introduced in this disclosure to overcome the above difficulties, referred to herein as "collapsible SAR algorithm". Several distinct characteristics are summarized below.

Unlike the conventional SAR algorithm in which binary values (0,1) are used for each bit, this new algorithm uses balanced ternary values (−1,0,+1) for each bit to encode analog input.

Unlike the conventional SAR algorithm in which a "test, keep, or discard" strategy is used to determine the value of each bit, this new algorithm simply compares the conversion residue to the mid-code of the remaining bits, and the polarity of this comparison is used to determine the MSB value of the remaining bits.

In addition to the conventional SAR of which the radix between adjacent bits is topped by 2 to avoid missing code in a binary search mechanism, this new algorithm further divides the bits into sections, and the bit weights in each section are designed such that, if conversion residue of the MSB in the section is less than the LSB reference level of the same section, the values of bits in this section can all be set to 0, or this section can be "collapsed."

Figure 10:
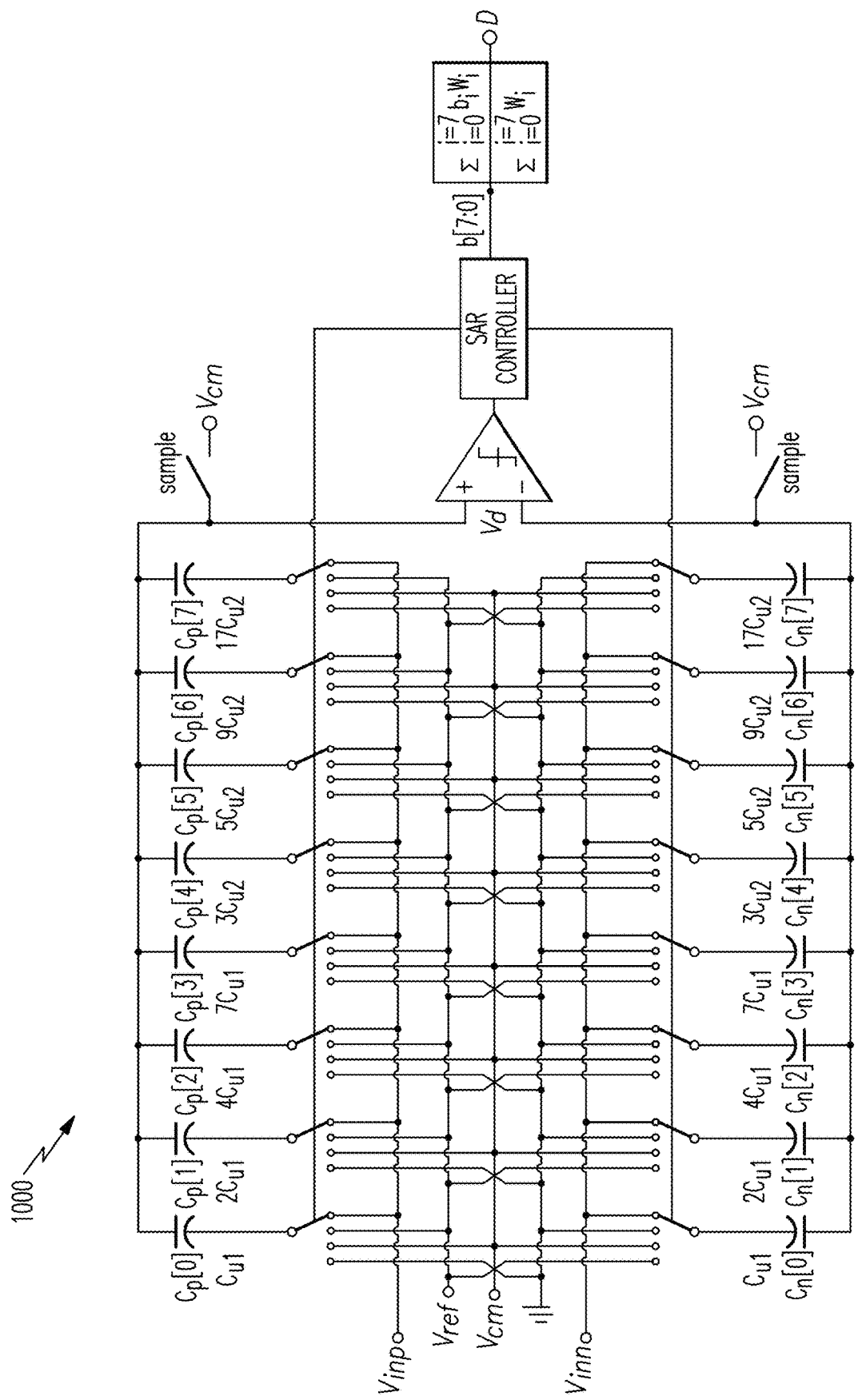
FIG. 10 illustrates an example of an 8-bit collapsible radix switched capacitor SAR ADC in accordance with certain embodiments of the disclosed technology.

FIG. 10 illustrates an example of an 8-bit collapsible radix switched capacitor SAR ADC 1000 in accordance with certain embodiments of the disclosed technology. The capacitor array in FIG. 10 is divided into two 4-bit sections: C[7:4] and C[3:0]. The unit capacitances of these sections can be different so long as C[4]/C[3]<=2 in order to avoid missing code (and the same constraint applies to any adjacent bits). Within each section, the bit weight of the MSB is the same as the sum of bit weights of LSBs in the same section. Specifically, C[7]=C[6]+C[5]+C[4] and C[3]=C[2]+C[1]+C[0]. This constraint is referred to herein as the "collapsible radices" of a section. Although a 4-bit section is used as an example, a collapsible section can be formed by any number (e.g., ≥2) of consecutive bits in general so long as the sum of the LSB weights of the section equals the MSB weight of the same section.

To simplify the description of this algorithm, all quantities in the following are normalized values, which are dimensionless. Specifically:

$$V_{ref} = 1$$
$$V_{cm} = \frac{V_{ref}}{2} = \frac{1}{2}$$
$$V[i] = \frac{C[i]}{C[0] + C[1] + \ldots + C[7]}$$

where V[i] is the normalized bit weight of bit b[i]. $V_{ref}=1$ indicates that the full scale differential input has amplitude of 1.

The following is the implementation of this collapsible SAR:

The input is sampled during the sampling phase, in which the bottom plates of all of the capacitors at the p-side and n-side are connected to $V_{inp}$ and $V_{inn}$ respectively, and their top plates are connected to $V_{cm}$.

In SAR conversion cycle 1, the top plates are disconnected from $V_{cm}$, and the bottoms of all of the capacitors are connected to $V_{cm}$. The corresponding code of this configuration is [0,0,0,0, 0,0,0,0], which is the mid-code of MSB. As a result, the floating top plate differential voltage will be $V_d(7)=-V_{in}$, which is the conversion residue of the MSB.

In order to illustrate the collapse algorithm, let us assume that the absolute value of the MSB residue $|V_d(7)|=|-V_{in}|<V[4]$, where V[4] is the bit weight of b[4] (the LSB weight of this collapsible section b[7:4]). Further, let us assume that this residue is a negative value ($V_d(7)<0$, or $V_{in}$ is a small positive signal) for convenience of explanation (if $V_{in}<0$, simply reverse the polarity of the following description).

With these assumptions, the comparator decision determines that the MSB b[7]=+1 (inverted from the residue polarity in order to pull the top plate differential voltage towards 0 to approximate the analog input).

In SAR conversion cycle 2, b[7]=+1 drives the bottom plate of $C_p[7]$ to $V_{ref}$ and that of $C_n[7]$ to 0. The mid-code of the second MSB b[6] is [1,0,0,0, 0,0,0,0], and the residue of b[6] is $V_d(6)=-V_{in}+V[7]$. Since $|V_{in}|<V[4]$, this residue is a positive number and the comparator decision will set b[6]=−1.

In SAR conversion cycle 3, b[6]=−1 drives the bottom plate of $C_p[6]$ to 0 and that of $C_n[6]$ to $V_{ref}$. The mid-code of the third MSB b[5] is [1,−1,0,0, 0,0,0,0], and the residue of b[5] is $V_d(5)=-V_{in}+V[7]-V[6]$. Since $|V_{in}|<V[4]$, this residue is still a positive number because V[7]−V[6]=V[5]+V[4] (recall that by weight design V[7]=V[6]+V[5]+V[4]). The comparator decision will set b[5]=−1.

In SAR conversion cycle 4, b[5]=−1 drives the bottom plate of $C_p[5]$ to 0 and that of $C_{n1}[5]$ to $V_{ref}$. The mid-code of the fourth MSB b[4] is [1,−1,−1,0, 0,0,0,0], and the residue of b[4] is $V_d(4)=-V_{in}+V[7]-V[6]-V[5]$. Since $|V_{in}|<V[4]$, this residue is still a positive number because V[7]−V[6]−V[5]=V[4]. The comparator decision will set b[4]=−1.

In SAR conversion cycle 5, the mid-code of b[3] becomes [1,−1,−1,−1, 0,0,0,0], and the residue of b[3] is $V_d(3)=-V_{in}+V[7]-V[6]-V[5]-V[4]$. Since the bit weights of b[7:4] are designed such that V[7]=V[6]+V[5]+V[4], the residue of b[3] is actually $V_d(3)=-V_{in}$, which is identical to the MSB residue $V_d(7)$. In other words, the mid-code of b[3] can be set to [0,0,0,0, 0,0,0,0] for the comparator to determine the value of b[3]. The first section can be collapsed from [1,−1,−1,−1] to [0,0,0,0].

In other words, in SAR conversion cycle 5, if bit pattern b[7:4]=[+1,−1,−1,−1] appears, it can be simply collapsed to [0,0,0,0] without changing the conversion residue of the next bit b[3]. Similarly, when the input is a small negative number, the same analysis as shown above leads to a pattern b[7:4]=[−1,+1,+1,+1], and this bit pattern can also be collapsed to b[7:4]=[0,0,0,0] without changing the conversion residue of the next bit b[3]. Such collapses are guaranteed by the collapsible weight design constraint V[7]=V[6]+V[5]+V[4].

In SAR conversion cycles 6~8, the values of b[2:0] are determined in the same way as described above for b[6:4]. If the absolute value of the residue of b[3]|$V_d(3)|=|-V_{in}|<V[0]$, where V[0] is the weight of b[0], then b[3:0] can also be collapsed to [0,0,0,0]. Again, a collapse decision of this section can be made by simply examining bit pattern b[3:0]: [+1,−1,−1,−1] or [−1,+1,+1,+1] which can be collapsed to [0,0,0,0].

If the absolute value of the conversion residue of the MSB of a section is larger than the LSB weight of the same section, the section cannot be collapsed. For example, in 5) above, the residue of b[4] is $V_d(4)=-V_{in}+V[7]-V[6]-V[5]=-V_{in}+V[4]$. If the MSB conversion residue $|V_d(7)|=|-V_{in}|>V[4]$ and $V_{in}>0$(assumption in 2)), this residue is a negative number and, thus, the comparator will decide that b[4]=+1. Then, the mid-code of b[3] becomes [1,−1,−1,+1, 0,0,0,0] with conversion residue $V_d(3)=-V_{in}+V[7]-V[6]-V[5]+V[4]=-V_{in}+2*V[4]$, which is not identical to the MSB residue $V_d(7)$. Therefore, the mid-code of b[3] cannot be set to the same as that of the MSB, or the first section cannot be collapsed to [0,0,0,0] before the polarity of b[3] is determined. In circuit implementation, however, the bit pattern b[7:4]=[+1,−1,−1,+1] is not a collapsible pattern and, therefore, cannot be collapsed to b[7:4]=[0,0,0,0].

Figure 11:
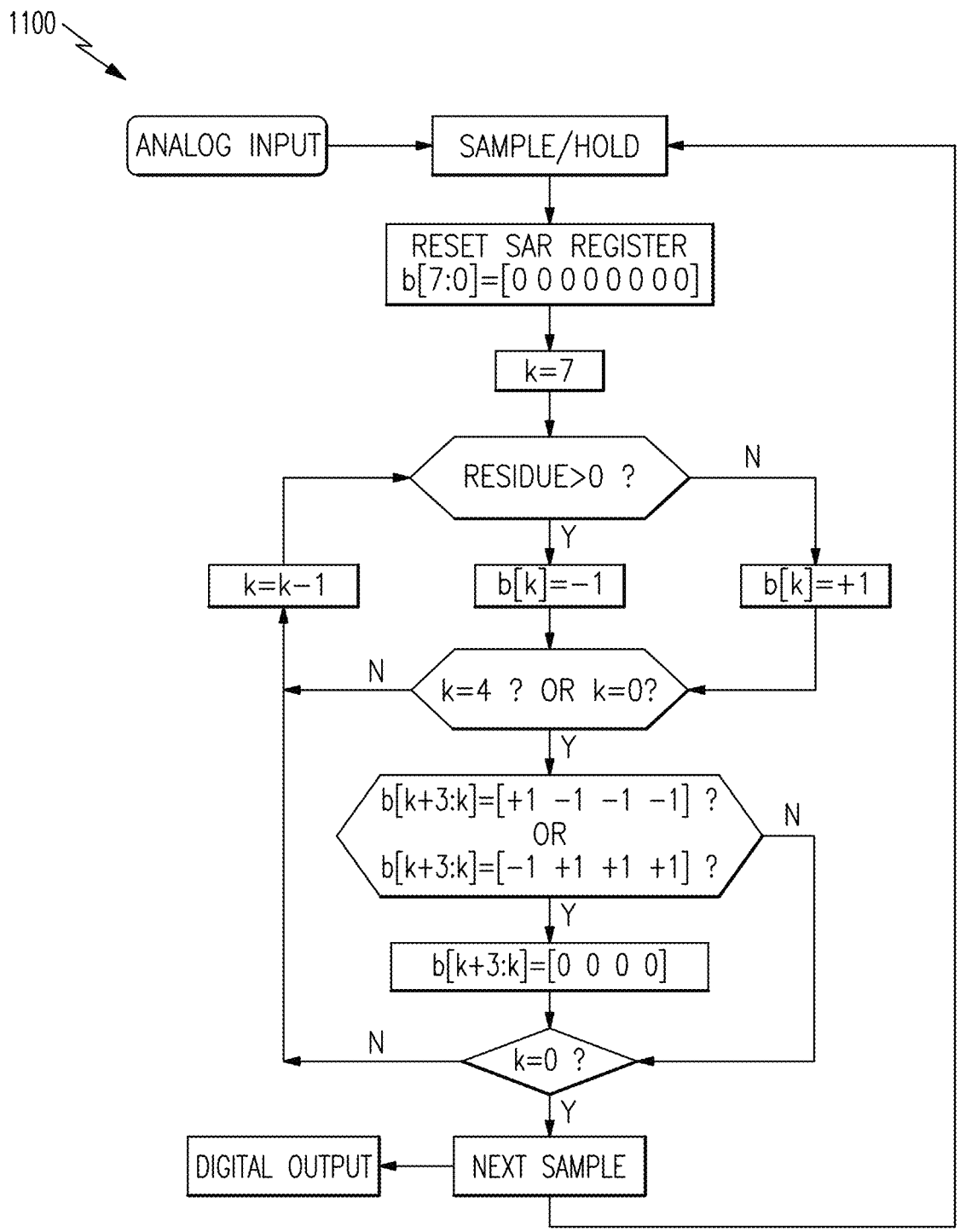
FIG. 11 illustrates an example of a flow chart that describes an algorithm used for two collapsible sections having 4 bits per section in accordance with certain embodiments of the disclosed technology.

The collapsible algorithm described above can be illustrated by the flow chart 1100 illustrated by FIG. 11. Note that, although the flow chart 1100 describes the algorithm used for two collapsible sections with 4 bits per section in the context of the above description, it can be easily modified to adapt to an implementation of virtually any number of collapsible sections with virtually any number of bits per section.

With this new collapsible algorithm, the accumulated calibration error introduced noise floor at small signal conditions will be substantially reduced. Let us examine the accumulated calibration error introduced noise floor at small signal conditions for a 20-bit collapsible radix SAR. Suppose these 20-bits are divided into five 4-bit sections. If the input signal is small enough, the SAR output code will be [0,0,0,0, 0,0,00, 00,0,0, 0,00,0, x,x,x,x] because all sections will be collapsed to 0 except the LSB section b[3:0]. When the SAR code is post processed by correction logic with calibrated weights to generate final digital output D:

$$D = \frac{\sum_{i=0}^{N-1} b_i W_i}{\sum_{i=0}^{N-1} W_i}$$

only the calibrated weights of the four LSBs b[3:0] will contribute to D. In other words, the calibration errors of the MSBs are irrelevant to D because the weights of those bits are not used due to the 0 values of the bits. Since only 4 bits exhibit non-zero values, the calibration error introduced noise floor can be calculated as $\sqrt{4}E=2E$ where E is the calibration resolution. Compared to the conventional SAR algorithm where the calibration error introduced noise floor is calculated as $\sqrt{19}E$ for a 20-bit SAR, the collapsible SAR algorithm reduces the noise floor by 6.8 dB, which is substantial It is worth to mention that, in general, in order to quantize an analog level into a balanced ternary code [−1, 0, +1], two comparators should be used to compare the analog level against two reference levels at each cycle. However, with the above-described collapsible algorithm combined with a collapsible radix design, only one comparator need be used to compare an analog level with a single reference level at each cycle. In other words, the collapsible algorithm may reduce power consumption in half for the desirable encoding system.

Figure 12:
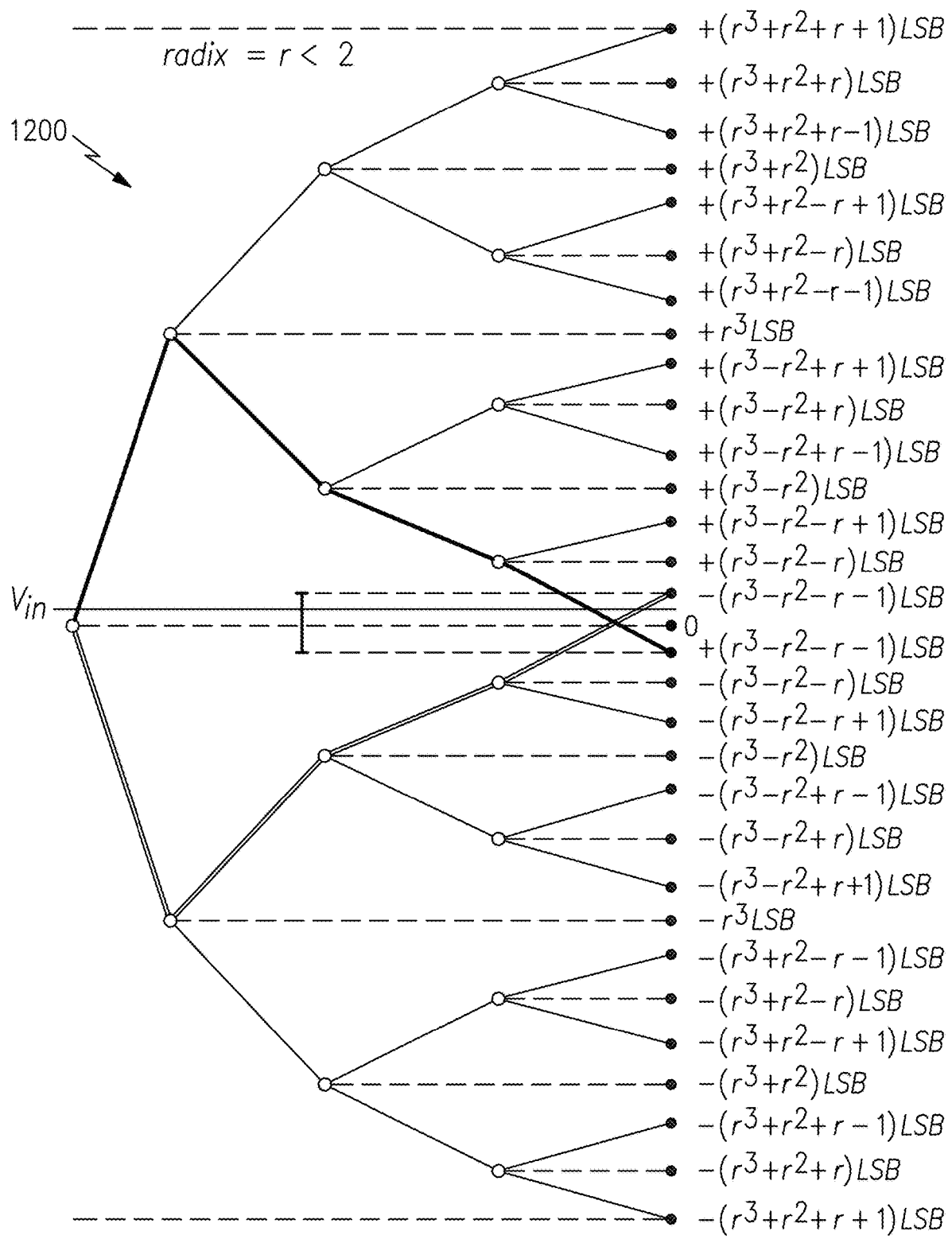
FIG. 12 illustrates an example of the decision tree for a non-binary radix SAR with balanced ternary encoding in accordance with certain embodiments of the disclosed technology.

Due to the balanced ternary value encoding system in which [−1,0,+1] are used for each bit, the redundancy range is naturally symmetrical around the mid-code of each decision point, as illustrated in FIG. 12, which illustrates an example of the decision tree 1200 for a non-binary radix SAR with balanced ternary encoding in accordance with certain embodiments of the disclosed technology. As in FIG.

4, the blue line indicates the analog input, which is slightly above the MSB level. The red trace is the correct decision tree for the analog input, which results in code [1, −1, −1, −1] that covers the input range between (r^3−r^2−r−1)*LSB and (r^3−r^2−r−1)*LSB.

Now suppose an error is made by the comparator that gives MSB=−1 instead of MSB=1, and no more mistake is made in subsequent SAR cycles: $V_{in}$>−r^3*LSB leads to b[2]=+1, $V_{in}$>(−r^3+r^2)*LSB leads to b[1]=1, and $V_{in}$>(−r^3+r^2) leads to b[0]=+1, therefore the green decision trace results in code [−1,+1,+1,+1]. This code covers the input range between (−r^3+r^2+r)*LSB and (−r^3+r^2+r+1)*LSB. This code also covers the true analog input as shown. In other words, the MSB error made by the comparator can be recovered by correct LSB decisions.

From FIG. 12 it can be seen that, so long as −(r^2+r+1−r^3)*LSB<$V_{in}$<(r^2+r+1−r^3)*LSB, the error decision at MSB can be recovered by correct decisions of lower bits, therefore the redundancy range is +/−(r^2+r+1−r^3)*LSB around the MSB, which is symmetrical around the MSB level.

In general, the redundancy range of bit k of a non-binary radix SAR with balanced ternary encoding can be calculated as $$R_k = \pm \left( \sum_{i=0}^{k-1} W_i - W_k \right)$$

where $W_k$ is the weight of b[k].

Since the redundancy range is symmetrical, the decision can be made around the mid-code of any bit without extra effort that is necessary for a non-binary radix SAR in a conventional binary encoding algorithm to center the redundancy range, as described above.

Excellent noise floor under small signal conditions and symmetry in redundancy range for a decision tree makes the collapsible radix SAR algorithm with balanced ternary value encoding superior to the conventional SAR implementation.

The resolution of a SAR can be improved by increasing the number of bits. For example, to achieve a quantization noise floor of −105 dBFS with a SAR that has average radix of 1.85, it needs at least 20 bits. In a switched capacitor implementation, the capacitance ratio between the MSB and the LSB will be 1.85^19≈119196. A Metal-Insulator-Metal (MIM) capacitor is often used in high performance analog circuits. In modern CMOS technology such as 65 nm processes, the minimum MIM capacitor that can be manufactured reliably is around 35 fF with a dimension of 4 μm^2. If a 20-bit SAR with average radix 1.85 is to be implemented by minimum unit capacitors, the total capacitance will be equivalent to about 0.26 million unit capacitors, which will occupy a chip area at least 5×10^6 μm^2≈2.2 mm×2.2 mm per capacitor array, which is too expensive to reasonably implement.

Figure 13:
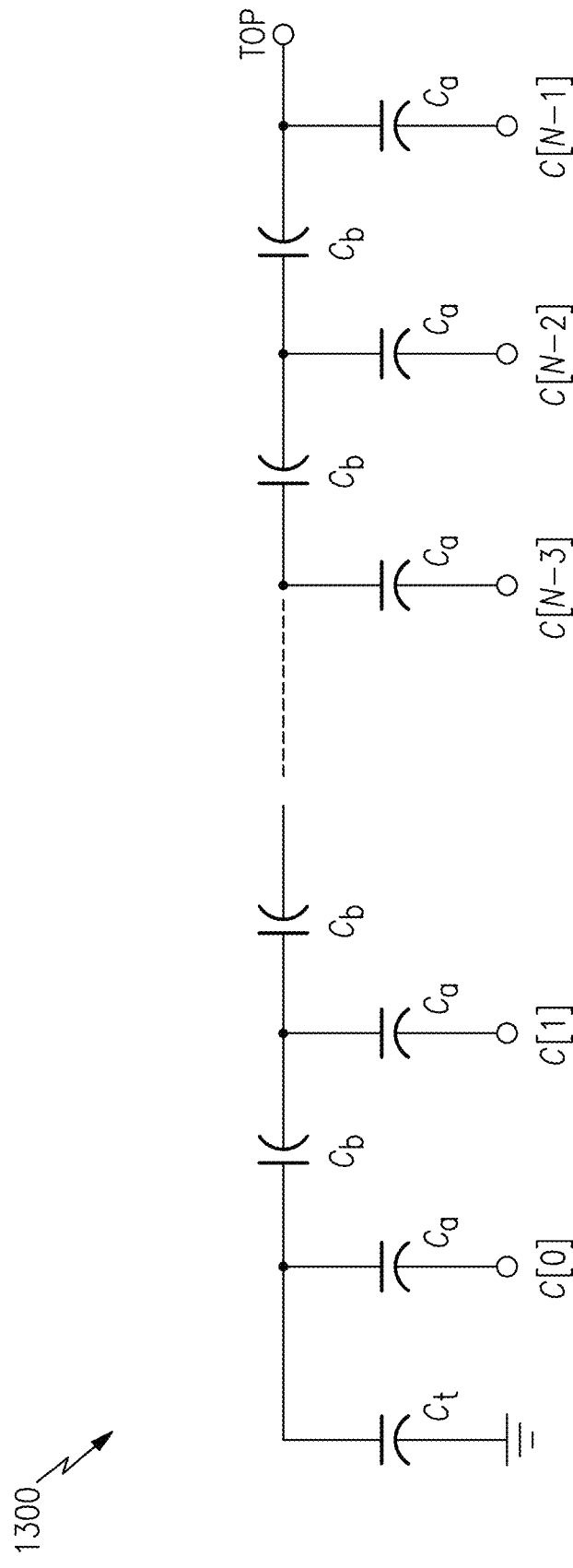
FIG. 13 illustrates an example of a C-2C network to implement an arbitrary radix capacitor array in accordance with certain embodiments of the disclosed technology.

FIG. 13 illustrates an example of a C-2C network 1300 to implement an arbitrary radix capacitor array in accordance with certain embodiments of the disclosed technology. In the illustrated C-2C network 1300, the termination capacitance $C_t$ may be calculated by the following formula:

$$C_t = \frac{C_a}{2}\left(\sqrt{1 + \frac{4C_b}{C_a}} - 1\right)$$

and the radix between adjacent bit capacitance relative to the top plate may be calculated as $$R = 1 + \frac{2}{\sqrt{1 + \frac{4C_b}{C_a}} - 1}$$

$C_a$ and $C_b$ may be implemented with integer multiples of unit capacitance. For example, if $C_b$=5*$C_u$, $C_a$=2*$C_u$, then the radix of adjacent capacitance relative to the top plate is 1.8633.

The area of a 20-bit capacitor array with radix of 1.8633, implemented with the C-2C network shown in FIG. 13, will be (19*(2+5)+2)*$C_u$+$C_t$≈138*$C_u$. If a unit capacitor occupies an area of 16 μm^2, the total area of this capacitor array is in the order of 50 μm×50 μm. Compared to the 2.2 mm×2.2 mm area needed by a simple unit capacitance implementation, this area is negligible.

It should be noted that a pure C-2C capacitor network is generally not used because the total capacitance of the non-binary radix cap array is limited by kT/C noise, the input signal will be attenuated by the cap array due to the comparator capacitive load to the top plate of the array, and it is generally difficult to design a collapsible section of which the bit weights satisfy the collapsible constraint.

In view of these practical concerns, a combination of a C-2C network and a parallel C network may be used to implement the collapsible SAR algorithm. In such an implementation, only the LSBs are implemented with the C-2C network to avoid large number of unit capacitors, and the C-2C section will not be collapsed during conversion. All collapsible sections are implemented with unit capacitance in parallel network among the MSBs. The following figure illustrates an example of such an arrangement.

Figure 14:
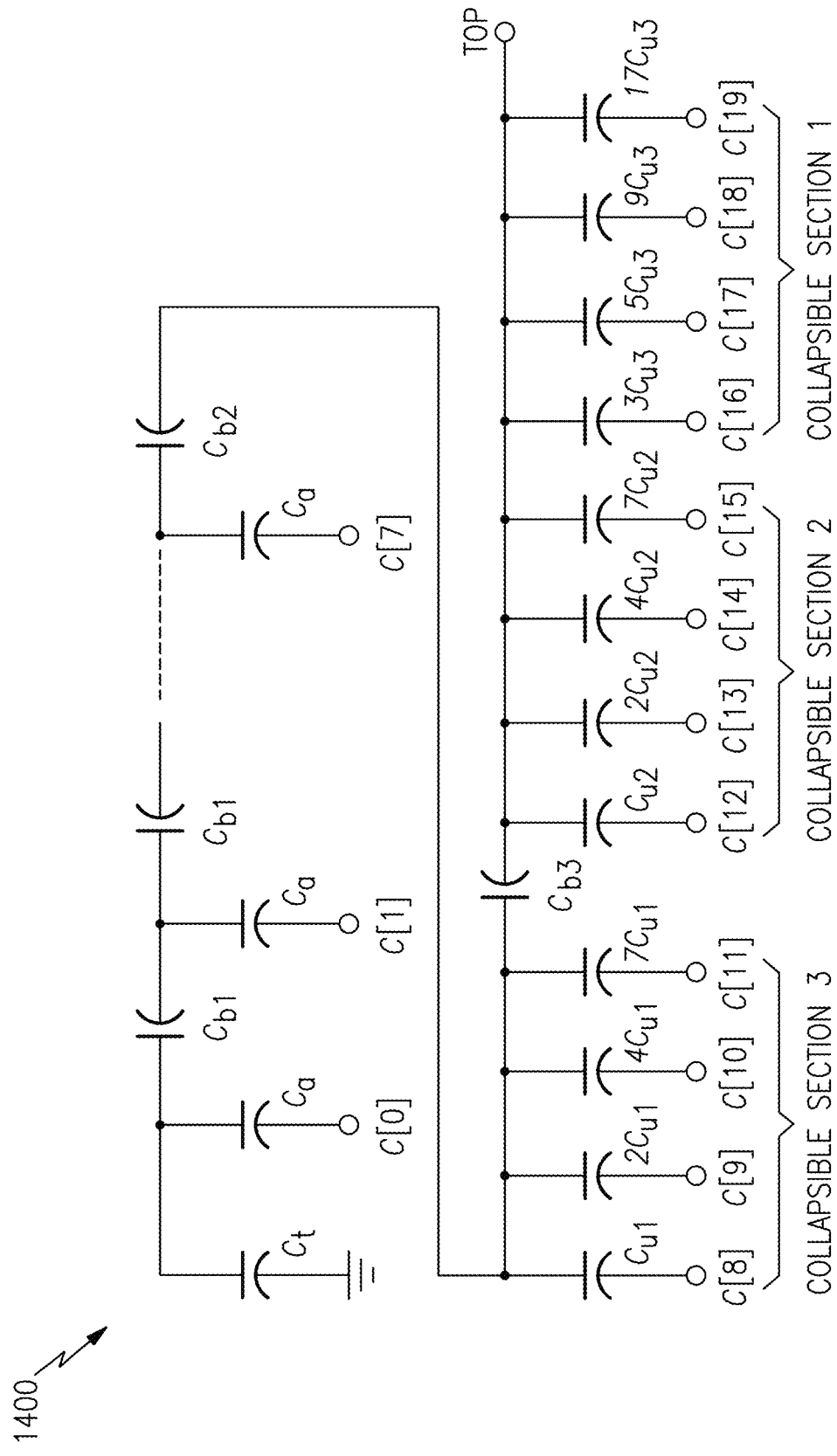
FIG. 14 illustrates an example of a 20-bit capacitor array that combines a C-2C network and a parallel C network in accordance with certain embodiments of the disclosed technology.

FIG. 14 illustrates an example of a 20-bit capacitor array 1400 that combines a C-2C network and a parallel C network in accordance with certain embodiments of the disclosed technology. The array 1400 includes three 4-bit collapsible sections that are located in 12 MSBs and 8 LSBs that are implemented with a C-2C network. The unit capacitances of collapsible sections 1, 2, and 3 are different from each other, and a bridge cap $C_{b3}$ is used between collapsible section 2 and section 3 to reduce unit capacitances in section 2 and section 1.

Sampling kT/C noise in the array 1400 is dominated by an 8-MSB parallel capacitor network. Also, due to their large total capacitance, signal attenuation due to the comparator capacitive load can be limited to within 10%. Because the C-2C capacitor network is used for 8 LSBs, compared to the previous example with a simple unit capacitor implementation that needs 2.2 mm×2.2 mm in area per array, the number of unit capacitors in the collapsible section can be reduced by a factor of 1.85^8=137 approximately, and the area could even be potentially reduced to less than 200 μm×200 μm per array. Although it is larger than the pure C-2C implementation, it is a reasonable compromise due to the practical concerns mentioned above.

With regard to the accumulated calibration error introduced noise floor under small signal conditions, because a C-2C capacitor network is not collapsible in general, under small signal conditions the accumulated calibration error introduced noise floor can be estimated as $\sqrt{8}E$ in the example 1400 shown in FIG. 14, as there are 8 weights that will be used to calculate the quantized small signal levels.

If every capacitor is calibrated individually, the SNR of the calibration ADC must be at least 20 log 10√8 dB=9 dB better than that of the SAR ADC itself. For example, if a SNR of 100 dB is to be achieved by a SAR, the SNR of its calibration ADC needs to be 109 dB. Although by using a switched capacitor ΔΣ ADC as the calibration ADC, such SNR is not impossible to achieve, a better way of calibration may be used to relax the SNR requirement of calibration ADC.

The MSB capacitor is not the full scale capacitor that is to be measured by the ΔΣ ADC. Instead, a lower bit capacitor will be used as the full scale capacitor for the calibration ΔΣ ADC. For example, C[14] can be designed as the largest capacitor that can be measured by the ΔΣ ADC. If the average radix from C[14] to C[0] is 1.85, the dynamic range of the capacitance values to be measured by the ΔΣ ADC will be 20 log $10(1.85^{14})$=74.8 dB. Since the calibration SNR needs to be 9 dB better than the capacitance dynamic range (as required by the accumulated calibration error introduced noise floor under small signal conditions), the SNR of the calibration ΔΣ ADC only needs to be better than 83.8 dB, which is an easy specification for a ΔΣ ADC.

In order to measure a capacitance that is larger than the full scale capacitance measurable by the calibration ΔΣ ADC, a certain combination of bits needs to be used. For example, suppose C[15]=7*$C_{u2}$ in FIG. 14 needs to be measured. Because it exceeds the largest capacitance (e.g., the same as C[14]=4*$C_{u2}$) measurable by the ΔΣ ADC, it cannot be measured directly. Instead, both C[14] and C[15] need to be used to dump charge to the integrator capacitor $C_{I1}$ in FIG. 6, and C[14] may be configured such that it dumps charge in opposite polarity compared to that of C[15], therefore a net capacitance of C=C[15]−[14]=3*$C_u$2 will be measured, then C[15] can be calculated by C[15]=C+C[14].

The same method can be applied to all capacitances of bits that are above C[14] in this example. Calibration error will generally be increased for these higher bits since more than one measure is needed for each bit, and this will slightly increase the calibration error introduced noise floor. However, this typically only happens under large signal conditions where these weights are used to calculate a quantized input signal level. Since slightly increased noise floor (which is often more than three orders of magnitude smaller than the signal level) is not important under large signal levels, this method has very little impact to practical applications.

Embodiments of the invention may operate on a particularly created hardware, on firmware, on Digital Signal Processors (DSPs), or on a specially programmed general purpose computer including a processor operating according to programmed instructions. The terms "controller" or "processor" as used herein are intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments.

In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this disclosure to a method having two or more defined steps or operations, the defined steps or operations can be carried out in any order or simultaneously, unless the context excludes those possibilities.

Furthermore, the term "comprises" and its grammatical equivalents are used in this disclosure to mean that other components, features, steps, processes, operations, etc. are optionally present. For example, an article "comprising" or "which comprises" components A, B, and C can contain only components A, B, and C, or it can contain components A, B, and C along with one or more other components.

Although specific embodiments of the invention have been illustrated and described for purposes if illustration, it will be understood that various modifications may be made without departing from the spirit and scope of the invention. Accordingly, the invention should not be limited except as by the appended claims.

What is claimed is:

1. A successive approximation register analog-to-digital converter, comprising:
    a voltage comparator having a first input, a second input, and an output;
    a first plurality of capacitors each having a first plate and a second plate, the first plate in electrical communication with the first input of the voltage comparator and switchably connectable to a common mode voltage, and the second plate switchably connectable to one of a first input voltage, a reference voltage, the common mode voltage, or a ground, and the common mode voltage equal to one-half of the reference voltage;
    a second plurality of capacitors each having a first plate and a second plate, the first plate in electrical communication with the second input of the voltage comparator and switchably connectable to the common mode voltage, the second plate switchably connectable to one of a second input voltage, the reference voltage, the common mode voltage, or the ground, and the first plurality of capacitors and the second plurality of capacitors collectively representing a set of bits; and
    a controller configured to implement a collapsible successive approximation register algorithm using balanced ternary values for each bit of the set of bits to encode an analog input.

2. The successive approximation register analog-to-digital converter of claim 1 wherein at least a first capacitor of the first plurality of capacitors and at least a first capacitor of the second plurality of capacitors collectively represent a most significant bit, and one or more additional capacitors of the first plurality of capacitors and one or more additional capacitors from the second plurality of capacitors collectively represent one or more least significant bits.

3. The successive approximation register analog-to-digital converter of claim 2 wherein a bit weight of the most significant bit is equal to a sum of bit weights of the one or more least significant bits.

4. The successive approximation register analog-to-digital converter of claim 2 wherein at least a second capacitor of the first plurality of capacitors and at least a second capacitor of the second plurality of capacitors collectively represent a second most significant bit, and a second one or more additional capacitors of the first plurality of capacitors and a second one or more additional capacitors from the second plurality of capacitors collectively represent a second one or more least significant bits.

5. The successive approximation register analog-to-digital converter of claim 4 wherein a bit weight of the most significant bit is equal to a sum of bit weights of the one or more least significant bits and a bit weight of the second most significant bit is equal to a sum of bit weights of the second one or more least significant bits.

6. The successive approximation register analog-to-digital converter of claim 2 wherein, as part of the collapsible successive approximation register algorithm, the controller is further configured to compare a conversion residue to a mid-code of at least a portion of the one or more least significant bits.

7. The successive approximation register analog-to-digital converter of claim 6 wherein the mid-code is half the reference voltage and, when the conversion residue is determined to be less than the mid-code, the at least the portion of the one or more least significant bits is collapsed to a '0' value.

8. The successive approximation register analog-to-digital converter of claim 1 wherein the set of bits are divided into a plurality of collapsible bit groupings with each collapsible bit grouping implemented by a subset of capacitors from the first plurality of capacitors and the second plurality of capacitors.

9. The successive approximation register analog-to-digital converter of claim 8 wherein the subset of capacitors is implemented as a C-2C network.

10. The successive approximation register analog-to-digital converter of claim 8 further comprising a bridge capacitor electrically connected between a first subset of capacitors corresponding to a first collapsible bit grouping from the plurality of collapsible bit groupings and a second subset of capacitors corresponding to a second collapsible bit grouping from the plurality of collapsible bit groupings.

11. The successive approximation register analog-to-digital converter of claim 1 wherein each second plate of the first plurality of capacitors is electrically connected to the first input voltage, each second plate of the second plurality of capacitors is electrically connected to the second input voltage, and each first plate of the first plurality of capacitors and the second plurality of capacitors is electrically connected to the common mode voltage during a sampling phase.

12. The successive approximation register analog-to-digital converter of claim 1 wherein each first plate of the first plurality of capacitors and the second plurality of capacitors is disconnected from the common mode voltage, and each second plate of the first plurality of capacitors and the second plurality of capacitors is electrically connected to the common mode voltage during a first conversion cycle.

13. The successive approximation register analog-to-digital converter of claim 12 wherein the controller is further configured to determine whether to collapse a bit grouping during a second conversion cycle based at least in part on a comparison between a conversion residue of a most significant bit of the bit grouping and a least significant bit weight of the bit grouping.

14. A successive approximation register analog-to-digital converter, comprising:
a voltage comparator having a first input, a second input, and an output;
a first plurality of capacitors each having a first plate and a second plate, the first plate in electrical communication with the first input of the voltage comparator and switchably connectable to a common mode voltage, and the second plate switchably connectable to one of a first input voltage, a reference voltage, the common mode voltage, or a ground, and the common mode voltage equal to one-half of the reference voltage;
a second plurality of capacitors each having a first plate and a second plate, the first plate in electrical communication with the second input of the voltage comparator and switchably connectable to the common mode voltage, the second plate switchably connectable to one of a second input voltage, the reference voltage, the common mode voltage, or the ground, and the first plurality of capacitors and the second plurality of capacitors collectively representing a set of bits; and
a controller configured to implement a collapsible successive approximation register algorithm that performs a comparison of a conversion residue to a mid-code of at least a portion of one or more least significant bits from the set of bits.

15. The successive approximation register analog-to-digital converter of claim 14 wherein the controller is further configured to determine a most significant bit from the portion of the one or more least significant bits from the set of bits based on a polarity of said comparison.

16. The successive approximation register analog-to-digital converter of claim 14 wherein the set of bits are divided into a plurality of collapsible bit groupings with each collapsible bit grouping implemented by a subset of capacitors from the first plurality of capacitors and the second plurality of capacitors, the subset of capacitors implemented as a C-2C network.

17. The successive approximation register analog-to-digital converter of claim 16 further comprising a bridge capacitor electrically connected between a first subset of capacitors corresponding to a first collapsible bit grouping from the plurality of collapsible bit groupings and a second subset of capacitors corresponding to a second collapsible bit grouping from the plurality of collapsible bit groupings.

18. The successive approximation register analog-to-digital converter of claim 14 wherein each second plate of the first plurality of capacitors is electrically connected to the first input voltage, each second plate of the second plurality of capacitors is electrically connected to the second input voltage, and each first plate of the first plurality of capacitors and the second plurality of capacitors is electrically connected to the common mode voltage during a sampling phase.

19. The successive approximation register analog-to-digital converter of claim 14 wherein each first plate of the first plurality of capacitors and the second plurality of capacitors is disconnected from the common mode voltage, and each second plate of the first plurality of capacitors and the second plurality of capacitors is electrically connected to the common mode voltage during a first conversion cycle, and the controller is further configured to determine whether to collapse a bit grouping during a second conversion cycle based at least in part on a comparison between a conversion residue of a most significant bit of the bit grouping and a least significant bit weight of the bit grouping.

20. A system configured to convert an analog input to a digital output, the system comprising:
   an analog input port;
   a digital output port; and
   a successive approximation register analog-to-digital converter connected between the analog input port and the digital output port, the successive approximation register analog-to-digital converter including: a voltage comparator having a first input, a second input, and an output; a first plurality of capacitors each having a first plate and a second plate, the first plate in electrical communication with the first input of the voltage comparator and switchably connectable to a common mode voltage, and the second plate switchably connectable to one of a first input voltage, a reference voltage, the common mode voltage, or a ground, and the common mode voltage a fraction of the reference voltage; a second plurality of capacitors each having a first plate and a second plate, the first plate in electrical communication with the second input of the voltage comparator and switchably connectable to the common mode voltage, the second plate switchably connectable to one of a second input voltage, the reference voltage, the common mode voltage, or the ground, and the first plurality of capacitors and the second plurality of capacitors collectively representing a set of bits; and a controller configured to implement a collapsible successive approximation register algorithm using balanced ternary values for each bit of the set of bits to encode an analog input.

* * * * *